United States Patent
Urabe

[19]

[11] Patent Number: 6,081,771
[45] Date of Patent: Jun. 27, 2000

[54] APPARATUS CHECKING METHOD AND APPARATUS TO WHICH THE SAME IS APPLIED

[75] Inventor: Ryo Urabe, Tokyo, Japan

[73] Assignee: NEC Corporation, Tokyo, Japan

[21] Appl. No.: 09/149,773

[22] Filed: Sep. 8, 1998

[30] Foreign Application Priority Data

Sep. 8, 1997 [JP] Japan .................................. 9-242581

[51] Int. Cl.[7] .................................................. G06F 11/00
[52] U.S. Cl. ........................ 702/185; 702/123; 714/52; 714/55; 714/703; 701/102; 701/115
[58] Field of Search .............................. 702/185, 89, 90, 702/123; 714/52, 55, 703; 701/102, 105, 115

[56] References Cited

U.S. PATENT DOCUMENTS

| Re. 31,582 | 5/1984 | Hosaka et al. ............................. 714/1 |
|---|---|---|
| 4,502,324 | 3/1985 | Marino et al. ........................... 701/115 |
| 5,418,719 | 5/1995 | Abe et al. ................................. 702/185 |
| 5,548,718 | 8/1996 | Siegal et al. .............................. 714/38 |
| 5,633,879 | 5/1997 | Potts et al. ................................ 714/738 |

FOREIGN PATENT DOCUMENTS 204438  8/1988  Japan .

*Primary Examiner*—Marc S. Hoff
*Assistant Examiner*—Bryan Bui
*Attorney, Agent, or Firm*—Ostrolenk, Faber, Gerb & Soffen, LLP

[57] ABSTRACT

In a method of checking an apparatus, failure time intervals of sections of an apparatus are divided into a plurality of failure time interval groups, each of which is indicated by a specific failure time interval. A plurality of check programs are classified into a plurality of groups corresponding to the plurality of failure time interval groups based on the failure time interval of the section corresponding to each of the plurality of check programs. A group execution time interval of each of the plurality of groups is determined based on the specific failure time interval. Then, each of the plurality of groups is executed based on the group execution time interval.

17 Claims, 6 Drawing Sheets

Fig. 5A (Hrs)

| MTBF | UNIT CHECK TIME | | CHECK EXECUTION TIME (H/10KHrs) | | | |
|---|---|---|---|---|---|---|
| | | | CHECK EXECUTION FREQUENCY | | | |
| | | | 12H | 24H | 36H | 48H |
| 10000 | 0.3 | | 250 | 125 | 83 | 63 |
| 3000 | 0.3 | | 250 | 125 | 83 | 63 |
| 1000 | 0.2 | | 167 | 83 | 56 | 42 |
| 300 | 0.2 | | 167 | 83 | 56 | 42 |
| TOTAL CHECK TIME | 1 | 396 | 834 | 416 | 278 | 208 |

41   42   43

Fig.5B (Hrs)

| MTBF | ANALYSIS TIME | PRODUCT CORRECTION TIME (H/10KHrs) | | | | |
|---|---|---|---|---|---|---|
| | | | CHECK EXECUTION FREQUENCY | | | |
| | | | 12H | 24H | 36H | 48H |
| 10000 | 1.0 | | 24 | 49 | 74 | 98 |
| 3000 | 3.3 | | 82 | 164 | 247 | 329 |
| 1000 | 10.0 | | 247 | 494 | 741 | 988 |
| 300 | 33.3 | | 824 | 1648 | 2472 | 3296 |
| TOTAL CORRECTION TIME | 48 | 1663 | 1177 | 2355 | 3534 | 4711 |

| DAY | TIME | Grp1 | Grp2 | Grp3 | Grp4 |
|---|---|---|---|---|---|
| FIRST DAY | 8:00 | ○ | ○ | ○ | ○ |
| | 20:00 | ○ | × | × | × |
| SECOND DAY | 8:00 | ○ | ○ | × | × |
| | 20:00 | ○ | × | ○ | × |
| THIRD DAY | 8:00 | ○ | ○ | × | ○ |
| | 20:00 | ○ | × | × | × |
| FOURTH DAY | 8:00 | ○ | ○ | ○ | × |
| | 20:00 | ○ | × | × | × |

APPARATUS CHECKING METHOD AND APPARATUS TO WHICH THE SAME IS APPLIED

BACKGROUND OF THE INVENTION

1. Field of the Invention

The present invention relates to check of an apparatus, and more particularly to a method of checking a computer control type apparatus based on self-check programs and the apparatus to which the method is applied.

2. Description of the Related Art

In a conventional method of checking a computer control type apparatus such as a manufacturing apparatus and a test apparatus based on check programs, many check items of sections of the apparatus are checked in a collective manner in a predetermined frequency, e.g., twice a day. The check generally requires a long time so that the operation time of the apparatus is decreased. Thus, a check method of a shorter check time is desired.

In order to solve the above-mentioned problem, various methods of checking an apparatus have been proposed heretofore. One check method is described in Japanese Laid Open Patent Application (JP-A-Showa 63-204438). In the conventional method, as shown in FIG. 1B, an check procedure for checking an manufacturing or testing apparatus of a computer control type is composed of a set 60 of operation checks such as check 1 to check n. FIG. 1A is a flow chart illustrating the check procedure for each operation check in the conventional method of testing the apparatus. When each operation check is performed in accordance with the check procedure shown in the flow chart of FIG. 1A, the apparatus check can be performed in a short time.

That is, as shown in FIG. 1A, a simple check is executed (Step 50). The check procedure of the simple check is determined in such a manner that the most typical check for check items is performed or a check using the most typical data is performed. In the simple check, even if a failure point cannot be specified, it is possible to detect the existence or nonexistence of the failure point in a short time.

Subsequent to the simple check, it is determined whether or not a detail check mode is set (Step 51). The detail check is performed only when the detail check mode is set (Step 52). The detail check is different from the simple check in that the detail check is performed using various data for each of various operations. Although a long check time is necessary, the results of the detailed check can be obtained. Thus, the detail check is superior in pointing out a failure point.

According to the above conventional method, only the simple check is performed in a usual apparatus periodic maintenance work and in the confirmation of the operation of the apparatus after repairing, so that the check time can be shortened. When a long time may be taken for search of any failure point or the confirmation of the operation of the apparatus after modification of the apparatus, the detail check can be performed to complement the simple check.

In this way, in the conventional method, since the most typical check is performed or a check using the most typical data is performed, the simple check can be performed in a short time. In the simple check, however, there is a case where the simple check lacks in guarantee of functions and performance of the apparatus.

Also, in the conventional method, there is a problem in that the operation time of the apparatus is decreased since a long time is required for a detail check for complete guarantee of functions and performance of the apparatus. This is because the complete guarantee can be accomplished by both of the simple check and the detail check. Therefore, it is not basically possible to omit the detail check.

Moreover, there is a case where the conventional method lacks in the guarantee of quality of products manufactured or tested by the apparatus in which any failure is detected. This is because it is difficult to correct the products when the failure is detected, since the check time interval is not considered. Therefore, there is a possibility that the products having any failure are provided into a market.

SUMMARY OF THE INVENTION

The present invention is accomplished in view of the above problems. Therefore, an object of the present invention is to provide a method of testing an apparatus, in which a self-check of the apparatus is effectively performed to provide the complete guarantee of functions and performance of the apparatus.

Another object of the present invention is to provide a method of checking an apparatus, in which it is possible to increase reliability of products which are manufactured and tested by the apparatus.

Also, still another object of the present invention is to provide a method of checking an apparatus, in which a check time can be reduced so that the productivity of the apparatus can be increased.

In order to achieve an aspect of the present invention, in a method of checking an apparatus, failure time intervals of sections of an apparatus are divided into a plurality of failure time interval groups, each of which is indicated by a specific failure time interval. A plurality of check programs are classified into a plurality of groups corresponding to the plurality of failure time interval groups based on the failure time interval of the section corresponding to each of the plurality of check programs. A group execution time interval of each of the plurality of groups is determined based on the specific failure time interval. Then, the plurality of check programs of each of the plurality of groups are executed based on the group execution time interval.

The method may further includes the step of ending the execution of the plurality of check programs of the group, when the executing result of at least one of the plurality of check programs of the group indicates to be a failure state.

In the above, the determining step may include determining the group execution time interval of each of the plurality of groups based on the specific failure time interval such that the group corresponding to the longer specific failure time interval is executed in the longer group execution time interval.

Also, the determining step may include determining the group execution time interval of each of the plurality of groups based on the specific failure time interval such that the group execution time interval of each of the plurality of groups is longer than the shortest one of the group execution time intervals of the plurality of groups by a factor of a positive integer.

Also, the executing step may include executing the plurality of check programs of each of the plurality of groups based on the group execution time interval such that the plurality of check programs are executed in an order of shorter group execution time intervals.

In addition, the determining step may include determining the group execution time interval of each of the plurality of groups based on the specific failure time interval such that the longest one of the group execution time intervals of the plurality of groups is shorter than the shortest one of manufacturing or testing times of products by the apparatus.

In order to achieve another aspect of the present invention, an apparatus having sections, includes a memory, a classifying section for classifying a plurality of check programs into a plurality of groups corresponding to a plurality of failure time interval groups based on a failure time interval of a section of the apparatus corresponding to each of the plurality of check programs to store the plurality of check programs in the memory in units of groups, the failure time intervals of the sections of the apparatus being divided into the plurality of failure time interval groups, each of which is indicated by a specific failure time interval. A determining section determines a group execution time interval of each of the plurality of groups based on the specific failure time interval. A timer counts time. An executing section reads out the plurality of check programs of the group corresponding to the counted time by the timer from the memory, and executes the plurality of check programs of each of the plurality of groups based on the group execution time interval.

In order to achieve still another aspect of the present invention, a method of checking an apparatus, includes of the steps:

dividing failure time intervals of sections of an apparatus into a plurality of failure time interval groups, each of which is indicated by a specific failure time interval;

classifying a plurality of check programs into a plurality of groups corresponding to the plurality of failure time interval groups based on the failure time interval of the section corresponding to each of the plurality of check programs;

determining a group execution time interval of each of the plurality of groups based on the specific failure time interval;

executing the plurality of check programs of each of the plurality of groups based on the group execution time interval; and ending the execution of the plurality of check programs of the group, when the executing result of at least one of the plurality of check programs of the group indicates to be a failure state.

BRIEF DESCRIPTION OF THE DRAWINGS

FIG. 5A is a table showing a relation of MTBF of the apparatus and check execution time, and FIG. 5B is a table showing a relation of MTBF of the apparatus and product correction time; and FIG. 6 is a diagram to explain the grouping of a plurality of check programs in accordance with the failure time interval in the present invention.

DESCRIPTION OF THE PREFERRED EMBODIMENTS

Next, a checking method of the present invention will be described below in detail with reference to the attached drawings.

Figure 1:
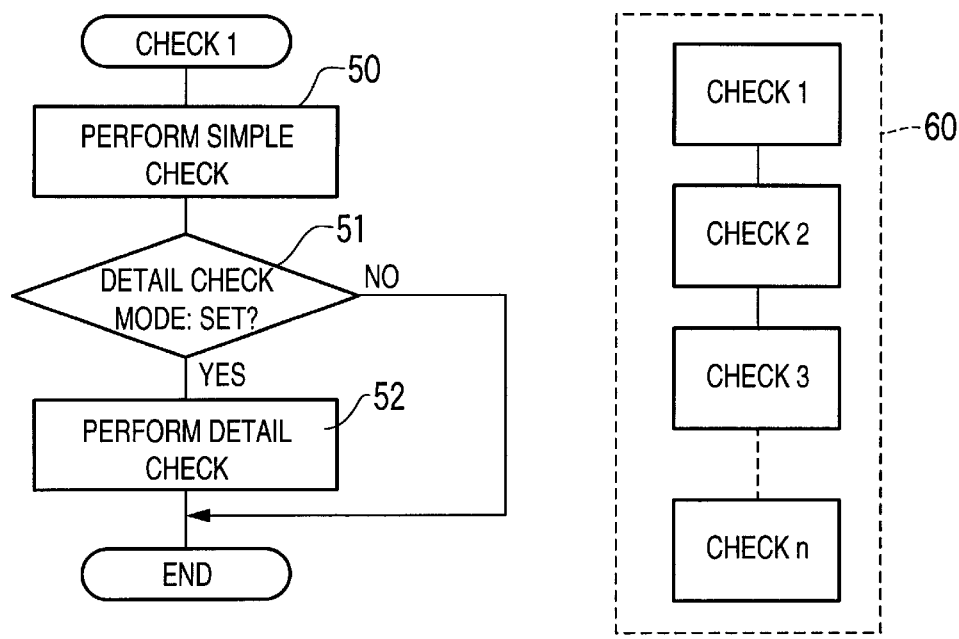
FIG. 1A is a flow chart illustrating an operation for each of checks in a conventional method.
FIG. 1B is a flow chart illustrating a set of checks.
Figure 2:
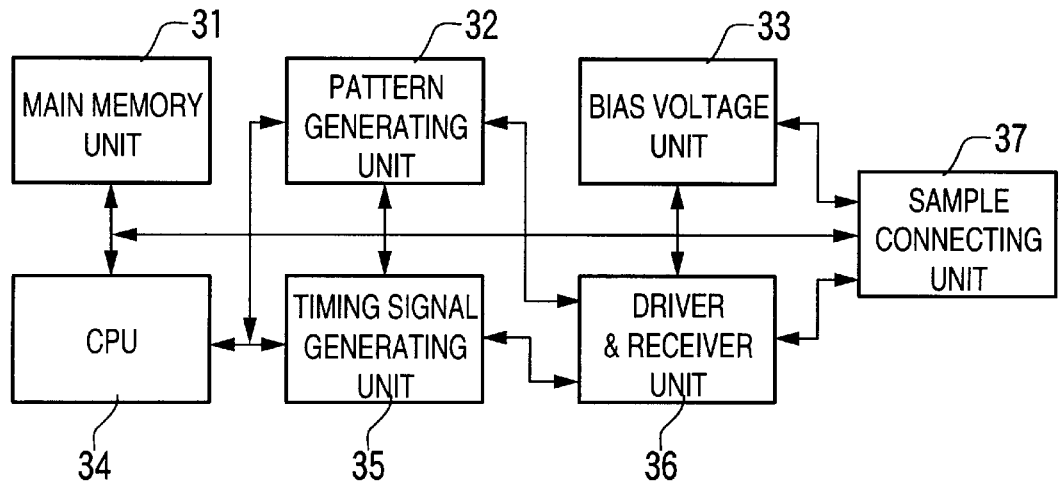
FIG. 2 is a block diagram of an apparatus to which the check method of the present invention is applied.

In the present invention, the checking method is applied to an apparatus such as a manufacturing apparatus or a testing apparatus. FIG. 2 shows a computer control type of testing apparatus for an integrated circuit. The testing apparatus has sections for automatically performing an electric test of the integrated circuit.

First, the testing apparatus of the computer control type will be described with reference to FIG. 2. Referring to FIG. 2, the testing apparatus of the integrated circuit is supposed to be operating under the support of an operation system in advance. A main memory unit 31 stores a plurality of check programs for self-check of the apparatus and an integrated circuit test program. A central processing unit (CPU) 34 reads out the integrated circuit test program for testing an integrated circuit from the main memory unit 31 to execute it. The CPU 34 has a timer (not shown) for counting time. Each time the counted time reaches a predetermined time, the CPU 34 outputs a test execution instruction to a pattern generating unit 32, a bias voltage unit 33, a timing signal generating unit 35 and a driver and receiver unit 36. At that time, the bias voltage unit 33 and the driver and receiver unit 36 give an electric test condition to the integrated circuit as a tested sample which is mounted in a sample connecting unit 37. Also, the driver and receiver unit 36 receives an electric signal sent out from the tested sample through the sample connecting unit 37.

In this way, the test of the integrated circuit is performed. The testing apparatus of the integrated circuit is controlled by the CPU 34 to execute a repetition operation of the electric test of the tested samples in order.

By the way, as seen in the example of such an testing apparatus of the integrated circuit, it is known that a self-check can be performed in the manufacturing or testing apparatus of the computer control type. Also, it is known that the failure time interval is not constant because of the sections of the apparatus, a design condition, a manufacturing condition, and a use condition.

Next, the start condition of the check program and the execution condition of the check program will be described below.

First, the execution condition of the check program will be described with reference to FIG. 5A. Referring to FIG. 5A, a plurality of check programs are grouped into a plurality of check groups in accordance with the failure time intervals or MTBFs of the sections corresponding to the plurality of check programs. That is, the plurality of check programs are classified into the check groups 1 to 4 based on four MTBF ranges. The first MTBF range is a range in which the MTBF is equal to or more than 300 hours and less than 1000 hours. The second MTBF range is a range in which the MTBF is equal to or more than 1000 hours and less than 3000 hours. The third MTBF range is a range in which the MTBF is equal to or more than 3000 hours and less than 10000 hours. The fourth MTBF range is a range in which the MTBF is equal to or more than 10000 hours.

In the FIG. 5A, a check execution time interval block 42 indicate an example of conventional methods in which the check execution time intervals are not classified in accordance with the MTBF and in which the check is performed for every 12 hours. This method is referred to as a "collective method (1)". A check execution time interval block 43 indicate another example of conventional methods in which the check execution time intervals are not classified in accordance with the MTBF and in which the check is performed for every 48 hours. This method is referred to as a "collective method (2)".

Next, a check execution time interval block 41 is a method of the present invention and it is referred to as a "present invention", hereinafter. In this method, when it is supposed that the check time interval of the product is equal to or longer than 3 days, the correction of the product is considered. In the checking method of the present invention, the plurality of check programs are classified into the four check groups 1 to 4 corresponding to the MTBF ranges.

That is, the check group 1 is executed in the time interval of 12 hours when the MTBF is more than 300 hours and less than 1000 hours. In this case, the check execution time is about 167 hours (=0.2*10000/12). Here, it is supposed that the total check time of the four check groups is 1 hour. The unit check times are allocated to the check groups 1 to 4 to be 0.2, 0.2, 0.3 and 0.3 hours, respectively.

Similarly, the check group 2 is executed in the time interval of 24 hours when the MTBF is equal to or more than 1000 hours and less than 3000 hours. In this case, the check execution time is about 83 hours (=0.2*10000/24).

The check group 3 is executed in the time interval of 36 hours when the MTBF is equal to or more than 3000 hours and less than 10000 hours.

In this case, the check execution time is about 83 hours (=0.3*10000/36). Also, the check group 4 is executed in the time interval of 48 hours when the MTBF is equal to or more than 10000 hours. In this case, the check execution time is about 63 hours (=0.3*10000/48). Therefore, the total check time is about 396 hours. It should be noted that the check time of 396 hours is needed for every 10,000 hours.

FIG. 6 shows the state in which the check execution time interval blocks are performed. In FIG. 6, the blocks Grp1, Grp2, Grp3 and Gr4 correspond to the checking methods which are executed for every 12 hours, every 24 hours, every 36 hours and every 48 hours, respectively.

With the start condition, FIG. 6 shows the dates and times when the blocks are started. The ○ mark indicates that the check is executed and the X mark indicates that the check is not executed. As seen from FIG. 6, the block (Grp1, Grp2, Grp3 and Grp4) are executed for every 12 hours, 24 hours, 36 hours and 48 hours.

In the present invention, the check groups 1 to 4 are executed in the same manner as the blocks Grp1, Grp2, Grp3 and Gr4.

Figure 3A:
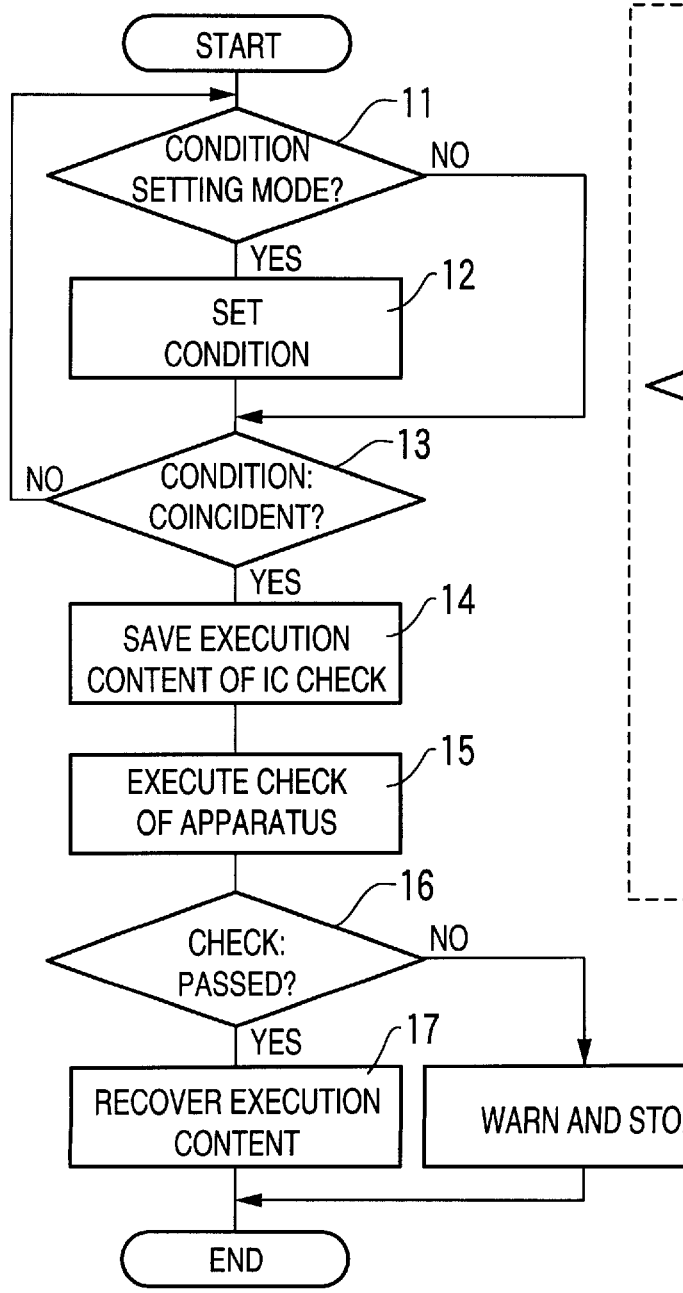
FIG. 3A is a flow chart illustrating an operation for each of check groups in a checking method according to a first embodiment of the present invention.

Next, the operation of the apparatus checking method according to the first embodiment of the present invention will be described with reference to FIGS. 3A and 3B. FIG. 3A is a check procedure of an apparatus checking method according to the first embodiment of the present invention, when a self-check of the manufacturing or testing apparatus of the computer control type is performed.

It is supposed that the CPU 34 starts the repetition operation of the electric test to the tested samples. At this time, first, whether or not a check condition setting or changing mode is set is determined in response to a condition setting inquiry from an operator (Step 11). In case that the check condition setting or change mode is set, the condition of the check program and the start condition of the check program are set or changed (Step 12). When the check condition setting or change mode is not set, or when the setting or change of the check condition is ended, it is determined in response to a condition coincidence inquiry whether the already set check condition is coincident with a desired check condition (Step 13). The control returns in response to the condition setting inquiry (step 11) if the check conditions are not coincident with each other. If the check conditions are coincident with each other, the execution result of the integrated circuit test program is saved (Step 14).

Because the saving of the execution content is not the main point of the present invention, only the simple explanation will be given. When the job of the integrated circuit test program being executing for one unit is ended, the repetition operation of the electric test is stopped. At the same time, the checking result and the integrated circuit test program being executed are saved in the main memory unit 31.

Next, the CPU 34 executes the self-check in accordance with the check group and the start condition of the check group (Step 15), i.e., one of the check groups 1 to 4 corresponding to the counted time. When the self check is ended, it is determined in response to a check PASS inquiry whether or not the check result indicates PASS (Step 16). When the check result indicates PASS, the recovery of the execution content is performed. Thus, the execution content which has been stopped previously and saved in the step 14 is recovered. Also, the repetition operation of the electric test is re-started (Step 17).

On the other hand, when it is determined not to be PASS in the determination which is performed in the step 16 in response to the check PASS inquiry, a warning is generated and the manufacturing and testing apparatus is stopped (Step 18).

Figure 3B:
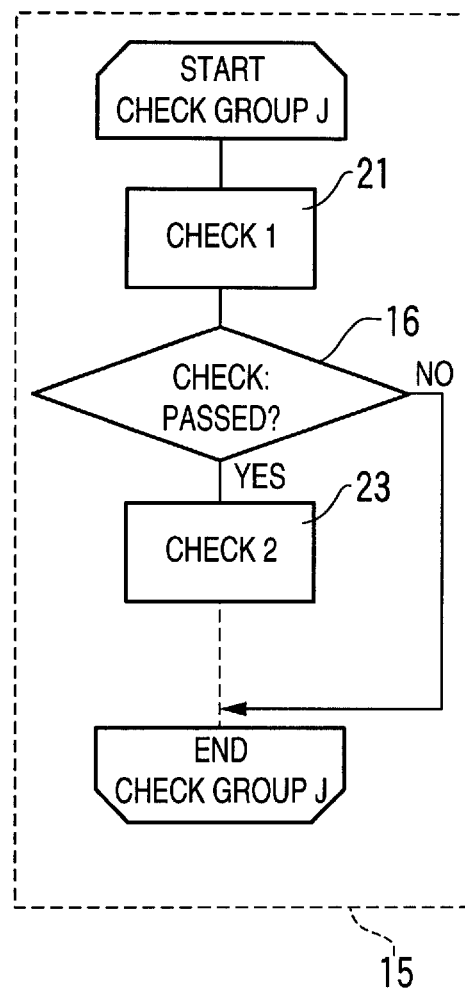
FIG. 3B is a flow chart illustrating a check procedure of the check group.

FIG. 3B shows the procedure of each check group. As shown in FIG. 3B, the check 1 of the check group j ($1 \leq j \leq 4$, j is an integer) is executed (Step 21). Subsequently, it is determined whether or not the check result of the check 1 is PASS (Step 22). When the check result is PASS, the next check is executed (Step 23). These processes are repeated. When any one of the checks of the check group j indicates that the check result is not PASS, the check group j is ended.

Next, the checking method according to the second embodiment of the present invention will be described.

In the checking method of the second embodiment, the execution time interval of each of the plurality of check groups is longer when the mean time between failures is longer. That is, the execution time interval is set such that (the execution time interval of the group j)<(the execution time interval of the group (j+1)).

Next, the checking method according to the third embodiment of the present invention will be described.

In the checking method of the third embodiment, the execution time interval of each of the plurality of check groups is longer than that of the check group with the shortest execution time interval by a factor of an positive integer. That is, when the execution time interval of the group j is T, the execution time interval of the group (j+1) is nT (n is a positive integer).

Next, the checking method according to the fourth embodiment of the present invention will be described.

In the checking method of the fourth embodiment, the execution order of the plurality of check groups is set in such a manner that the check group with the shortest execution time interval is first executed and then the check group with the next shorter execution time interval is executed. That is, when the means time between failures of the check group j is MTBFj and the means time between failures of the check group (j+1) is MTBF(j+1), and when the check group j and the check group (j+1) are started at the same time, the check group j is first executed and then the check group (j+1) is executed.

Next, the checking method according to the fifth embodiment of the present invention will be described.

In the checking method of the fifth embodiment, the execution time interval of one of the plurality of groups having the longest execution time interval is shorter than the shortest manufacturing or checking time interval of the product which is produced or tested by the apparatus. That is, (the shortest manufacturing or checking time interval of the product)>(the longest execution time interval of the check group).

Next, the total effect of the above embodiments will be described.

Referring to FIG. 5A, it could be seen that the total check execution time has the relation of "collective method (2)"<"the present invention"<"collective method (1)". It should be noted that the check time is calculated based on (10000 hours×unit check time)/ MTBF. That is, because the execution frequency of the check group is set in accordance with the failure time interval, the total check time is 834 hours in the "collective method (1)" in which the check execution time interval block 42 of FIG. 5A is executed for every 12 hours, for example. Whereas, the total check time is reduced to 396 hours in the checking method of the present invention, in which each of the check groups 1 to 4 of the check execution time interval block 41 of FIG. 5A are executed for every 12 hours, 24 hours, 36 hours and 48 hours, respectively.

Next, the failure analysis time and the correction time of the product is considered in FIG. 5B. The number of times of failure detection is 48 times (10000/MTBF in this case) irrespective of the check execution time interval. When the failure analysis time per once is 1 hour, the total analysis time is about 48 hours.

When the correction time of the product in FIG. 5B is seen, the product correction time block 45 is a method in which the check is collectively performed for every 12 hours without classifying the check groups based on the MTBFs. This method corresponds to the "collective method (1)". Also, the product correction time block 44 corresponds to the checking method of the present invention. If the product correction is considered when it is supposed that the product manufacturing or checking time is equal to or more than 3 days, the product correction time block 46 is a method in which the check is collectively performed for every 48 hours without classifying the check groups based on the MTBFs. This method corresponds to the "collective method (2)".

In this case, the total correction time has the relation of "collective method (2)">"the present invention">"collective method (1)". It should be noted that in the product correction procedure, the products of 3% of the population parameter are extracted and checked again. If any failure is detected when (1, 0) determination is performed, all the products are tested again.

Therefore, if the check execution time interval is long, the check execution time becomes short. However, the correction time becomes long. Also, depending on the failure point of the apparatus, the failure sometimes largely influences to the check results of the products. Therefore, a ratio of re-check of all the products sometimes increases. FIG. 5B shows the worst case of the total product correction time. In this case, it is supposed that 40% of the product parameter is re-checked. Generally, the ratio of the re-check of all the products is less than several percents.

Figure 4:
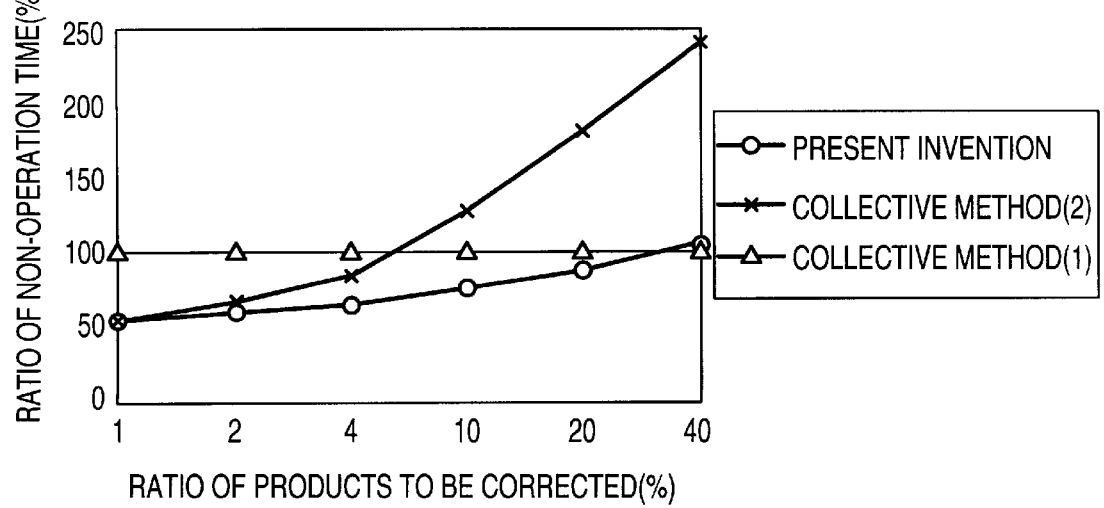
FIG. 4 is a graph used to describe the non-operation time of the apparatus when the checking method of the present invention is applied.

In this way, the non-operation time of the apparatus at the time of the failure detection is composed of a summation of the total check time, the analysis time and the total product correction time. FIG. 4 shows a comparison example of non-operation times ratio of apparatus.

In FIG. 4, using the "collective method (1)" as a reference, the non-operation times of the "collective method (2)" and "the present invention" are shown in the vertical axis of the non-operation time ratio and the ratio of products to be corrected is shown in the horizontal axis. FIG. 4 shows the comparison between the collective methods (1) and (2) and the present invention, when the ratio of the re-tested products to the product population parameter is changed from 1% to 40%. As seen from FIG. 4, the non-operation time of the "present invention" becomes the smallest.

As described above, according to the present invention, because the execution frequency of the check group is set in accordance with the failure time interval, the failure can be efficiently detected in relatively short check execution time.

Also, according to the present invention, the execution time interval of each of the plurality of check group is longer than that of the check group with the shortest execution time interval of the check programs by a factor of a positive integer. Therefore, when the check is started at the same time, a loss time necessary to save the execution content and to recover the execution content can be removed. Thus, the loss time which accompanies check execution can be reduced.

Also, according to the present invention, the point with high failure frequency is possible to be checked in a short time interval, the time required for the failure detection can be reduced.

Moreover, according to the present invention, (the shortest manufacturing or checking time interval of the product) >(the longest execution time interval of the check group). Thus, because the product correction is made possible, the outflow of the defective products can be prevented even when the failure of the apparatus is detected as a result of the check.

From above, according to the present invention, the self-check of the apparatus is effectively performed to provide the complete guarantee of functions and performance of the apparatus. Also, it is possible to increase the reliability of products which are manufactured and tested by the apparatus. In addition, the check time can be reduced so that the productivity of the apparatus can be increased.

What is claimed is:

1. A method of checking an apparatus, comprising of the steps:

dividing failure time intervals of sections of an apparatus into a plurality of failure time interval groups, each of which is indicated by a specific failure time interval;

classifying a plurality of check programs into a plurality of groups corresponding to the plurality of failure time interval groups based on the failure time interval of the section corresponding to each of the plurality of check programs;

determining a group execution time interval of each of the plurality of groups based on the specific failure time interval; and executing the plurality of check programs of each of the plurality of groups based on the group execution time interval.

2. A method according to claim 1, further comprising the step of ending the execution of the plurality of check programs of the group, when the executing result of at least one of the plurality of check programs of the group indicates to be a failure state.

3. A method according to claim 1, wherein said determining step includes determining the group execution time interval of each of the plurality of groups based on the specific failure time interval such that the group corresponding to the longer specific failure time interval is executed in the longer group execution time interval.

4. A method according to claim 1, wherein said determining step includes determining the group execution time interval of each of the plurality of groups based on the specific failure time interval such that the group execution time interval of each of the plurality of groups is longer than the shortest one of the group execution time intervals of the plurality of groups by a factor of a positive integer.

5. A method according to claim 1, wherein said executing step includes executing the plurality of check programs of each of the plurality of groups based on the group execution time interval such that the plurality of check programs are executed in an order of shorter group execution time intervals.

6. A method according to claim 1, wherein said determining step includes determining the group execution time interval of each of the plurality of groups based on the specific failure time interval such that the longest one of the group execution time intervals of the plurality of groups is shorter than the shortest one of manufacturing or testing times of products by the apparatus.

7. An apparatus having sections, comprising:

a memory;

classifying means for classifying a plurality of check programs into a plurality of groups corresponding to a plurality of failure time interval groups based on a failure time interval of a section of said apparatus corresponding to each of said plurality of check programs to store said plurality of check programs in said memory in units of groups, said failure time intervals of said sections of said apparatus being divided into said plurality of failure time interval groups, each of which is indicated by a specific failure time interval;

determining means for determining a group execution time interval of each of the plurality of groups based on the specific failure time interval; and a timer for counting time; and executing means for reading out said plurality of check programs of the group corresponding to the counted time by said timer from said memory, and for executing said plurality of check programs of each of the plurality of groups based on the group execution time interval.

8. An apparatus according to claim 7, wherein said executing means includes judging means for judging whether the executing result of at least one of said plurality of check programs of the group indicates to be a failure state of said apparatus, and for ending the execution of said plurality of check programs of the group, when the executing result of at least one of said plurality of check programs of the group indicates to be a failure state.

9. An apparatus according to claim 7, wherein said determining means determines the group execution time interval of each of said plurality of groups based on the specific failure time interval such that the group corresponding to the longer specific failure time interval is executed in the longer group execution time interval.

10. An apparatus according to claim 7, wherein said determining means determines the group execution time interval of each of said plurality of groups based on the specific failure time interval such that the group execution time interval of each of said plurality of groups is longer than the shortest one of the group execution time intervals of said plurality of groups by a factor of a positive integer.

11. An apparatus according to claim 7, wherein said executing means executes said plurality of check programs of each of the plurality of groups based on the group execution time interval such that said plurality of check programs are executed in an order of shorter group execution time intervals.

12. An apparatus according to claim 7, wherein said determining means determines the group execution time interval of each of said plurality of groups based on the specific failure time interval such that the longest one of the group execution time intervals of said plurality of groups is shorter than the shortest one of manufacturing or testing times of products by the apparatus.

13. A method of checking an apparatus, comprising of the steps:

dividing failure time intervals of sections of an apparatus into a plurality of failure time interval groups, each of which is indicated by a specific failure time interval;

classifying a plurality of check programs into a plurality of groups corresponding to the plurality of failure time interval groups based on the failure time interval of the section corresponding to each of the plurality of check programs;

determining a group execution time interval of each of the plurality of groups based on the specific failure time interval;

executing the plurality of check programs of each of the plurality of groups based on the group execution time interval; and ending the execution of the plurality of check programs of the group, when the executing result of at least one of the plurality of check programs of the group indicates to be a failure state.

14. A method according to claim 13, wherein said determining step includes determining the group execution time interval of each of the plurality of groups based on the specific failure time interval such that the group corresponding to the longer specific failure time interval is executed in the longer group execution time interval.

15. A method according to claim 13, wherein said determining step includes determining the group execution time interval of each of the plurality of groups based on the specific failure time interval such that the group execution time interval of each of the plurality of groups is longer than the shortest one of the group execution time intervals of the plurality of groups by a factor of a positive integer.

16. A method according to claim 13, wherein said executing step includes executing the plurality of check programs of each of the plurality of groups based on the group execution time interval such that the plurality of check programs are executed in an order of shorter group execution time intervals.

17. A method according to claim 13, wherein said determining step includes determining the group execution time interval of each of the plurality of groups based on the specific failure time interval such that the longest one of the group execution time intervals of the plurality of groups is shorter than the shortest one of manufacturing or testing times of products by the apparatus.

* * * * *